(12) United States Patent
Vedantham et al.

(10) Patent No.: US 7,594,154 B2
(45) Date of Patent: Sep. 22, 2009

(54) ENCODING AND DECODING MODULES WITH FORWARD ERROR CORRECTION

(76) Inventors: Ramakrishna Vedantham, 814 W. Royal La., #349, Irving, TX (US) 75038; David Leon, 900 Meadow Creek Dr., #3061, Irving, TX (US) 75038; Igor Curcio, Hatanpään valtatie 12C57, FI-33100 Tampere (FI)

( * ) Notice: Subject to any disclaimer, the term of this patent is extended or adjusted under 35 U.S.C. 154(b) by 505 days.

(21) Appl. No.: 10/991,968

(22) Filed: Nov. 17, 2004

(65) Prior Publication Data

US 2006/0107169 A1    May 18, 2006

(51) Int. Cl.
*H03M 13/00* (2006.01)
(52) U.S. Cl. ............ 714/752; 714/786
(58) Field of Classification Search ............. 714/752, 714/758, 801, 786
See application file for complete search history.

(56) References Cited

U.S. PATENT DOCUMENTS

| | | | |
|---|---|---|---|
| 7,000,177 B1 * | 2/2006 | Wu et al. | 714/801 |
| 7,127,659 B2 * | 10/2006 | Richardson et al. | 714/758 |
| 7,162,684 B2 * | 1/2007 | Hocevar | 714/800 |
| 7,174,495 B2 * | 2/2007 | Boutillon et al. | 714/752 |
| 2003/0014716 A1 * | 1/2003 | Ariel | 714/792 |
| 2004/0021588 A1 | 2/2004 | Luby | |

OTHER PUBLICATIONS

"Raptor Codes", Amin Shokrollahi, Digital Fountain, Inc., Jan. 13, 2004, 35 pages.
"FLUTE-File Delivery over Unidirectional Transport", IETF RMT Working Group, RFC3926, Oct. 2004, http://www.ietf.org/rfc3926.txt.
Network Working Group, RFC 3450, "Asynchronous Layered Coding (ALC) Protocol Instantiation", Luby et al., Dec. 2002, www.ietf.org/rfc/rfc3450.text?number=3450, 30 page document.
Network Working Group, RFC 3451, "Layered Coding Transport (LCT) Building Block", Luby et al., Dec. 2002, 29 page document.
Network Working Group, RFC 3926, "FLUTE—File Delivery over Unidirectional Transport", Paila et al., Oct. 2004, 35 page document.

* cited by examiner

*Primary Examiner*—Esaw Abraham

(57) ABSTRACT

To support a forward error correction scheme, in which a code of the forward error correction scheme is employed at a transmitting end for encoding data for a transmission to a receiving end, the transmitting end compresses at least one binary parity check matrix associated to the employed code of the forward error correction scheme. The transmitting end then provides the compressed binary parity check matrix for a transmission to the receiving end. The receiving end receives the compressed binary parity check matrix and decompresses it for use in a forward error correction based on encoded data received from the transmitting end.

43 Claims, 9 Drawing Sheets

ENCODING AND DECODING MODULES WITH FORWARD ERROR CORRECTION

FIELD OF THE INVENTION

The invention relates to methods for supporting a forward error correction scheme. The invention relates equally to an encoding module, to a decoding module, to electronic devices, to software program products and to a communication system supporting a forward error correction scheme.

BACKGROUND OF THE INVENTION

When a transmitting end transmits data packets to a receiving end via a packet switched communication network, for instance via the Internet or an IP based wireless network, some of the data packets may be corrupted or lost on the way. It is therefore common practice to transmit in addition error correction data to the receiving end. The error correction data may enable the receiving end to restore corrupted or lost data to a considerable extent.

In order to minimize the amount of data which has to be transmitted, the error correction data may be transmitted, for example, only in case the receiving end does not acknowledge safe reception of a transmitted data packet. Using an acknowledgement protocol is not feasible for point-to-multipoint transmissions, though. For ensuring a reliable transmission in a multicast transmission, conventionally a Forward Error Correction (FEC) scheme is implemented. Such an FEC scheme includes sending by default a certain amount of redundant data, which can assist a receiving end in reconstructing erroneous or missing data.

For producing the redundant data for an FEC scheme, various types of coding can be employed. The Low Density Parity Code (LDPC) family comprises a class of FEC codes which result in encoded data that can be decoded efficiently using a message-passing algorithm over a graph. When used for erasure correction, the application of a message-passing algorithm is equivalent to solving a set of linear equations by recursive substitution. This type of decoding is also referred to as a chain reaction decoding.

A parity check matrix which is associated to the employed code uniquely determines the decoding graph or the set of linear equations which have to be solved. The parity check matrix H of a binary LDPC consists of 'ones' and 'zeros'. The 'ones' are randomly placed in the column depending on the so-called degree distribution. The parity check matrix of binary LDPC has been dealt with for example in the document: "Low Density Parity-Check Codes", MIT Press, Cambridge, Mass., 1963, by R. G. Gallager, to which it is referred.

There exist many types of LDPC codes that result in different decoding performances, depending on the dimensions of the LDPC parity check matrix and the degree distribution of the associated graph. Some common codes comprise, for example, regular LDPCs, irregular LDPCs, a Low Density Generator Matrix (LDGM) codes, Luby Transform (LT) codes, Raptor codes, etc.

Further, the dimensions of an LDPC parity check matrix may be pre-determined or may be changed on the fly as new output symbols are generated, for example in the case of LT codes and Raptor codes.

Two or more LDPC codes may also be cascaded for various reasons that include, but are not limited to, better decoding performance, lower complexity, ease of encoding, etc.

In all cases, the receiving end must know the particular parity check matrix of each constituent code for setting up the correct graph for message-passing decoding. The parity check matrix has thus to be signaled to the receiving end.

The LDPC codes are particularly efficient when they are adapted to encode large blocks of data. For example, the block length is typically a few thousands of data symbols. Accordingly, the number of elements in the parity check matrix is very large, typically a few millions. It is therefore of importance that the parity check matrix is signaled in an efficient manner to the receiving end.

The Asynchronous Layered Coding (ALC) Protocol Instantiation is a base protocol at the application layer that supports a massively scalable, reliable multicast transport of arbitrary binary objects. ALC is defined for example in the document RFC 3450: "Asynchronous Layered Coding (ALC) Protocol Instantiation", December 2002, which is incorporated by reference herein. The File Delivery over Unidirectional Transport (FLUTE) protocol is a multicast transport protocol that builds on ALC. The FLUTE protocol ensures specifically for file deliveries that the receiving ends know what the transmitted objects actually represent. The FLUTE protocol provides a mechanism for signaling and mapping the properties of files to the concepts of ALC in a way that allows receivers to assign those parameters for received objects. FLUTE is defined for example in the document RFC 3926: "FLUTE—File Delivery over Unidirectional Transport", October 2004, which is equally incorporated by reference herein.

Both ALC and FLUTE recommend the use of a FEC building block for providing a reliable transport of files over unreliable unidirectional point-to-multipoint links.

The overall ALC packet format is shown in FIG. 1.

An ALC packet comprises a User Datagram Protocol (UDP) header, an LCT packet header, an FEC Payload ID portion and an Encoding Symbols portion.

Encoding symbols are what the receiving end uses to reconstruct an object.

A default LCT packet header comprises as required sections an array of flags, an LCT header length field HDR_LEN, a Codepoint (CP) field and a Congestion Control Information (CCI). In addition, the LCT packet header may comprise optional sections, including for example Transport Object Identifier (TOI) fields. Moreover, header extensions can be used to extend the LCT header portion. The presence of header extensions can be inferred by prior fields in the LCT header, for example the LCT header length field HDR_LEN. One defined Protocol Instantiation specific extension is the FEC Object Transmission Information (FEC OTI) extension EXT_FTI. The LCT header format including the required fields, optional fields and header extensions is presented in FIG. 2. The LCT header is described in more detail in the document RFC 3451: "Layered Coding Transport (LCT) Building Block", December 2002, which is incorporated by reference herein.

The CodePoint (CP) field of the LCT header can be used for signaling an FEC Encoding Identifier (ID). The FEC Encoding ID specifies an employed FEC scheme in a broader sense, for example 'No-Code', a Reed-Solomon code 'RS', an 'LDGM' code, a Raptor code, etc.

The FEC Payload ID of the ALC packet is used to identify an FEC Encoding Symbol with respect to the particular FEC scheme and the associated source-blocking algorithm. Obviously, the FEC Payload ID depends on the FEC Encoding ID. For example, in the case of a 'No-Code' FEC defined by the FEC Encoding ID, the FEC Payload ID comprises only a Source Block Number (SBN) and an Encoding Symbol ID (ESI). The SBN identifies from which source block of the object the encoding symbols in the payload are generated, while the ESI identifies which specific encoding symbols generated from the source block are carried in the packet payload.

Even for a given FEC Encoding ID, various implementations of the codec may be possible. For example, when RS codes are used, two known implementations are possible: a Vandermonde matrix based implementation and a Cauchy matrix based implementation. For this case, a FEC Instance ID is associated to the FEC Encoding ID, which signals a specific implementation type.

Apart from this information, a set of parameters specific to a particular FEC algorithm must be signaled to the receiving end, including the elements of the parity check matrix associated to an employed FEC code. A FEC building block of ALC has a provision to signal this information in the form of FEC Object Transmission Information (FEC OTI).

The above cited document RFC 3926 provides more specifically that the FEC OTI information is transmitted either in the separate header extension EXT_FTI or in an FDT Instance object.

An EXT_FTI field for FEC OTI may be included in all ALC packets of a delivery session or in a subset of these ALC packets. As indicated above, the field HDR_LEN, for example, may signal whether EXT_FTI for FEC OTI is included in a particular ALC packet. The format of the EXT_FTI is defined in the above cited document RFC 3926, according to which it comprises a general EXT_FTI format followed by a specific EXT_FTI format corresponding to the FEC Encoding ID. The EXT_FTI format for including the FEC OTI is presented in FIG. 3. The FEC OTI can be included in the indicated "FEC Encoding ID specific format" portion of a corresponding EXT_FTI. The FEC OTI can be included in the EXT_FTI of any ALC packet, if it is rather small.

If the FEC OTI is quite long, in contrast, it is preferably signaled as part of an FDT Instance.

In general, an FDT provides a means to describe various attributes associated with files that are to be delivered within a file delivery session. Within the file delivery session, the FDT is delivered as FDT Instances. An FDT Instance of FLUTE typically consists of general information about each of the files transmitted in the current session. This information is conveyed in the encoding symbols portion of the ALC packet using an extensible Markup Language (XML) schema. The FDT Instance describes at least the two attributes TOI and URI of each file. Additionally it may describe other attributes of each file, like Content-Encoding, Content-Type, and Transfer-Length, etc. In addition, each FDT Instance must have a header extension of the LCT header called EXT_FDT that contains an FDT Instance ID. The FDT Instance ID is used to uniquely identify an FDT Instance in a session.

If the FEC OTI is included in the FDT, the FDT Instance may span over several ALC packets. The information in the FDT Instance packets is very critical for the recovery of the entire file. Therefore, they must be reliably communicated to all receiving ends. This can be achieved by carousel or by FEC, that is, by protecting the group of packets belonging to an FDT Instance by an FEC scheme. The parameters of the FEC scheme used to protect the FDT Instance packets can be signaled to the receiving ends.

For signaling the required parity check matrix in the FEC OTI with a small amount of data to a receiving end, it has been proposed for Raptor codes that only a 4-byte KEY is included in every ALC packet, in order to provide the receiving end with information on how to generate one column of the parity check matrix. The generation of the parity check matrix from a KEY is not straightforward, though. It involves the use of a random number generator and a series of XOR operations.

Further, it has been proposed to use a virtual machine that can run a bytecode for the generation of an LDPC parity check matrix at the receiving end. The bytecode consists of a set of instructions for the virtual machine. The bytecode size is a few hundred Bytes for simple regular LDGM codes. For irregular LDPC codes and Raptor codes, the bytecode may be much longer. The bytecode may be sent as a part of the FEC OTI. It is a disadvantage of this approach that the bytecode instructions for a virtual machine can be complex and may consume a significant amount of computational resources at the receiving end.

Both approaches thus have the drawback that the generation of the parity check matrix at the decoder could make the decoder more complex.

SUMMARY OF THE INVENTION

It is an object of the invention to enable an efficient signaling of a binary parity check matrix of a forward error correction scheme.

For a transmitting end, a method for supporting a forward error correction scheme is proposed, wherein at least one code of the forward error correction scheme is employed at the transmitting end for encoding data for a transmission to a receiving end. The method comprises compressing at least one binary parity check matrix associated to the at least one code of the forward error correction scheme. The method further comprises providing the at least one compressed binary parity check matrix for a transmission to the receiving end.

For a transmitting end, moreover an encoding module is proposed, wherein at least one code of a forward error correction scheme is employed at the transmitting end for encoding data for a transmission to a receiving end. The proposed encoding module comprising a matrix compression portion adapted to compress at least one binary parity check matrix which is associated to the at least one code of the forward error correction scheme. The matrix compression portion is further adapted to provide the at least one compressed binary parity check matrix for a transmission to the receiving end.

For a transmitting end, moreover an electronic device is proposed. This electronic device comprises an encoding portion adapted to encode data for a transmission to a receiving end using at least one code of a forward error correction scheme. The electronic device comprises in addition a matrix compression portion adapted to compress at least one binary parity check matrix associated to the at least one code of the forward error correction scheme, and adapted to provide the at least one compressed binary parity check matrix for a transmission to the receiving end.

For a transmitting end, moreover a software program product is proposed, in which a software code for supporting a forward error correction scheme is stored. It is assumed that at least one code of the forward error correction scheme is employed at a transmitting end for encoding data for a transmission to a receiving end. When running at a transmitting end, the software code realizes the method proposed for a transmitting end.

For a receiving end, a method for supporting a forward error correction scheme is proposed. This method comprises receiving at least one compressed binary parity check matrix from a transmitting end. The method further comprises decompressing the at least one compressed binary parity check matrix for use in a forward error correction based on encoded data received from the transmitting end.

For a receiving end, moreover a decoding module supporting a forward error correction scheme is proposed. The decoding module comprises a matrix decompression portion adapted to decompress at least one compressed binary parity check matrix received from a transmitting end. The matrix decompression portion is further adapted to provide the at least one decompressed binary parity check matrix for a forward error correction based on encoded data received from the transmitting end.

For a receiving end, moreover an electronic device is proposed. This electronic device comprises a matrix decompression portion adapted to decompress at least one compressed binary parity check matrix received from a transmitting end. The electronic device moreover comprises a decoding portion adapted to use the at least one decompressed binary parity check matrix in a forward error correction based on encoded data received from the transmitting end.

For a receiving end, moreover a software program product is proposed, in which a software code for supporting a forward error correction scheme is stored. When running at a receiving end, this software code realizes the method proposed for a receiving end.

Finally, a communication system is proposed, which comprises the proposed encoding module and the proposed decoding module.

The invention proceeds from the consideration that a binary parity check matrix used for a FEC scheme is usually very sparse, that is, most elements of such a matrix usually have the same value. A binary LDPC matrix, for example, consists only of 'ones' and 'zeros', and in any column of this matrix the number of 'ones' is much smaller compared to the number of 'zeros'. Such a distribution of values provides a basis for an efficient compression by means of a suitable compression scheme. An efficiently compressed matrix can then be transmitted itself to a receiving end.

It is an advantage of the invention that the data amount required for signaling a parity check matrix itself to a receiving end can be reduced significantly by the proposed compression. The receiving end does not need to know beforehand the encoding scheme used by the transmitting end. At the same time, complex computations for calculating the required parity check matrix are not needed, if the receiving end has access to the matrix itself in a compressed form. For instance, no complex processing for decrypting a KEY for deriving the parity-check matrix is needed. The invention thus allows using a receiving end with a generic equation-solving decoder, which does not have to understand a KEY.

In a first embodiment of the invention, the binary parity check matrix comprises entries having a first value, for example 'zero', and entries having a second value, for example 'one'. Moreover, the binary parity check matrix is compressed by run-length encoding the entries having the first value. As the first value, the value should be selected which is associated to more entries in the matrix than the other value. The values resulting in this run-length encoding can then be provided for a transmission to the receiving end. The entire parity check matrix can easily be reconstructed at the receiving end by means of a simple run-length decoding.

Advantageously, the values resulting in the run-length encoding are binary encoded before transmission. When using a variable length encoding for the binary encoding, the amount of data required for the transmission can be minimized.

In a further embodiment of the invention, the binary parity check matrix comprises entries having a first value, for example 'one', and entries having a second value, for example 'zero'. Moreover, the binary parity check matrix is compressed by selecting the row and column indices of the entries in the matrix having the first value. As the first value, the value should be selected which is associated to less entries in the matrix than the other value. The selected indices may then be provided for transmission to the receiving end. The entire parity check matrix can easily be reconstructed at the receiving end by generating a matrix having the second value in all entries and substituting the first value at the positions indicated by the row and column indices.

The data amount which is to be transmitted for a parity check matrix can be minimized, if for each row of the matrix comprising at least one entry having the first value, a single row index and all column indices for each of the entries having the first value are provided for a transmission to the receiving end. In a similar alternative, for each column of the matrix comprising at least one entry having the first value, a single column index and all row indices for each of the entries having the first value may be provided for a transmission to the receiving end.

In some codes such as Raptor codes, two LDPC codes are applied in a cascaded manner to data symbols. In case at least two cascaded codes of a forward error correction scheme are employed at the transmitting end for encoding data for a transmission to the receiving end, a distinct binary parity check matrix is associated to each of the at least two cascaded codes. In one embodiment of the invention, each of these at least two binary parity check matrices is compressed separately and provided for a transmission to the receiving end.

The invention that can be employed for any binary parity check matrix, in particular for any LDPC matrix.

In one embodiment of the invention, the encoded data is to be transmitted to the receiving end in ALC packets and the at least one compressed parity check matrix is included in FEC OTI in at least one ALC packet for transmission to the receiving end.

The FEC OTI can be included for example in a FEC OTI header extension (EXT_FTI) of at least one ALC packet.

Alternatively, the FEC OTI can be included for example in an XML schema of an FDT Instance included in an encoding symbols portion of at least one ALC packet. In a first approach, the binary data is embedded to this end directly in an XML object using a CDATA tag. In a second approach, the binary data is encoded to this end into a text-based format, which is set as the contents of an XML object. If the size of the resulting FDT Instance exceeds the maximum payload portion size of the ALC packet, the FDT Instance may be distributed to several ALC packets.

Advantageously, it is ensured that the receiving end receives the compressed parity check matrix data in the delivery session reliably. Therefore, an FDT Instance including the compressed matrix data transferred in one or more ALC packets may be FEC protected as well, just like any payload data. In this case, the parameters of the FEC used for protecting the FDT Instance have to be signaled in advance, for example by using another unprotected FDT instance or any other reliable mechanism.

In some cases, the at least one compressed binary parity check matrix might be considered to be still too large to be reliably sent using FDT or EXT_FTI. In these cases, the at least one compressed parity check matrix may be stored at a download address at the transmitting end for a download by the receiving end only the download address is actively transmitted to the receiving end. The download address may be for example a Uniform Resource Locator (URL). This approach implies, however, that the receiving end has to establish a connection to the transmitting end to download the compressed matrix data from the specified download address, for example an HTTP connection to download the compressed matrix data from a specified URL. It is to be understood that the provision of a compressed parity check matrix for transmission to a receiving end in accordance with the invention includes such a provision for a download by the receiving end.

It is to be noted that the presented exemplary approaches for transmitting the at least one compressed binary parity check matrix to the receiving end may also be combined. For example, the compressed parity check matrix and associated data may be transmitted partly in an EXT_FTI field and partly in an FDT Instance.

The electronic device for the transmitting end can be any device which is adapted to transmit FEC encoded data to a receiving end, possibly but not necessarily in a multicast transmission. The electronic device can be for example, though not exclusively, a content server or a part of a content server.

The electronic device for the receiving end can be any device which is adapted to receive FEC encoded data. The electronic device can be for example, though not exclusively, a user device, like a mobile terminal or a personal computer, or a part of such a user device.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not drawn to scale and that they are merely intended to conceptually illustrate the structures and procedures described herein.

DETAILED DESCRIPTION OF THE INVENTION

Figure 4:
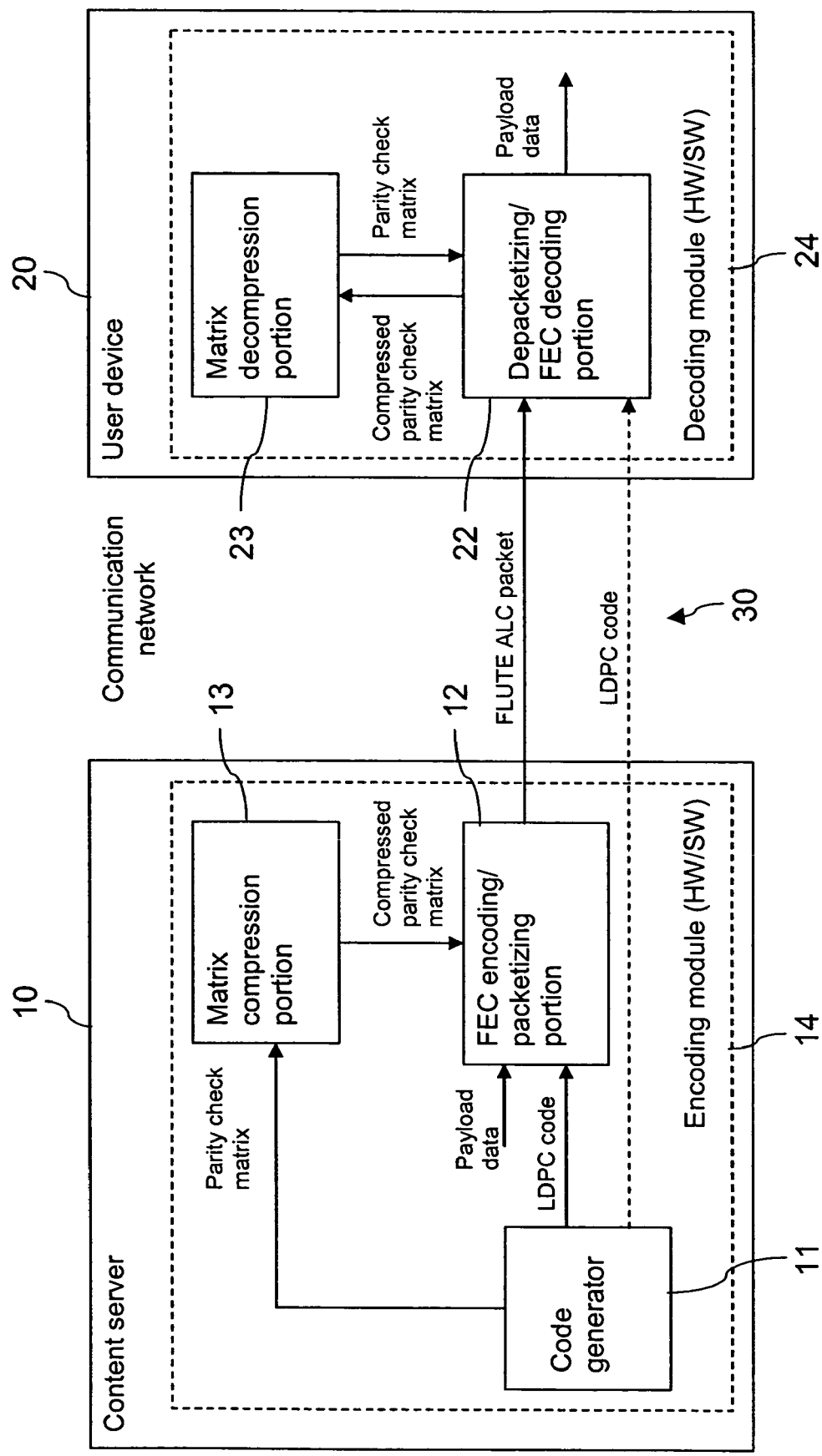
FIG. 4 is a schematic diagram of a system according to an embodiment of the invention.

FIG. 4 is a schematic diagram of a communication system which enables an efficient signaling of a binary FEC parity check matrix in accordance with the invention.

The communication system comprises a content server 10 and a user device 20, which are able to exchange data via a communication network 30. The content server 10 may form a part of the communication network 30 or be connected to the communication network 30.

The content server 10 includes a code generator 11, which generates LDPC codes as a basis for an FEC encoding of payload data and associated LDPC parity check matrices as a basis for an FEC decoding of FEC encoded data. The content server 10 further includes an encoding and packetizing portion 12. The encoding and packetizing portion 12 FEC encodes a predetermined number of data symbols with at least one LDPC code received from the code generator 11 to obtain parity symbols. The data symbols and the parity symbols are distributed by the encoding and packetizing portion 12 to the encoding symbols portion of subsequent FLUTE ALC packets, in order to enable a reliable multicast file transfer from the content server 10 via the communication network 30 to a plurality of user devices 20.

In addition, the content server includes a matrix compression portion 13. The matrix compression portion 13 compresses a parity check matrix received from the code generator 11 and provides the resulting bitstream to the encoding and packetizing portion 12. Here, the bitstream is inserted in a predetermined manner into an ALC packet, as will be described in more detail further below with reference to FIGS. 5 to 8.

The code generator 11, the encoding and packetizing portion 12 and the matrix compression portion 13 form part of an encoding module 14. The encoding module 14 can be implemented entirely by software (SW) but at least partly as well in hardware (HW).

The user device 20 includes a depacketizing and decoding portion 22 and a matrix decompression portion 23, both forming a part of a decoding module 24. The decoding module 14 can be implemented entirely by software (SW) but at least partly as well in hardware (HW).

The depacketizing and decoding portion 22 receives FLUTE ALC packets from the content server 10, extracts the content and provides file data symbols, which may be included in an encoding symbols portion, as payload data to an appropriate application of the user device 20. In case the ALC packet comprises a bitstream representing a compressed parity check matrix, this bitstream is provided to the matrix decompression portion 23. The matrix decompression portion 23 restores the original parity check matrix. This restoration will be described in more detail further below with reference to FIG. 7. The parity check matrix is then provided to the depacketizing and decoding portion 22. The depacketizing and decoding portion 22 may use the parity check matrix for a conventional FEC, in order to restore data symbols in corrupted or lost ALC packets, making use of the data symbols and the parity symbols included in the received ALC packets.

Figure 5:
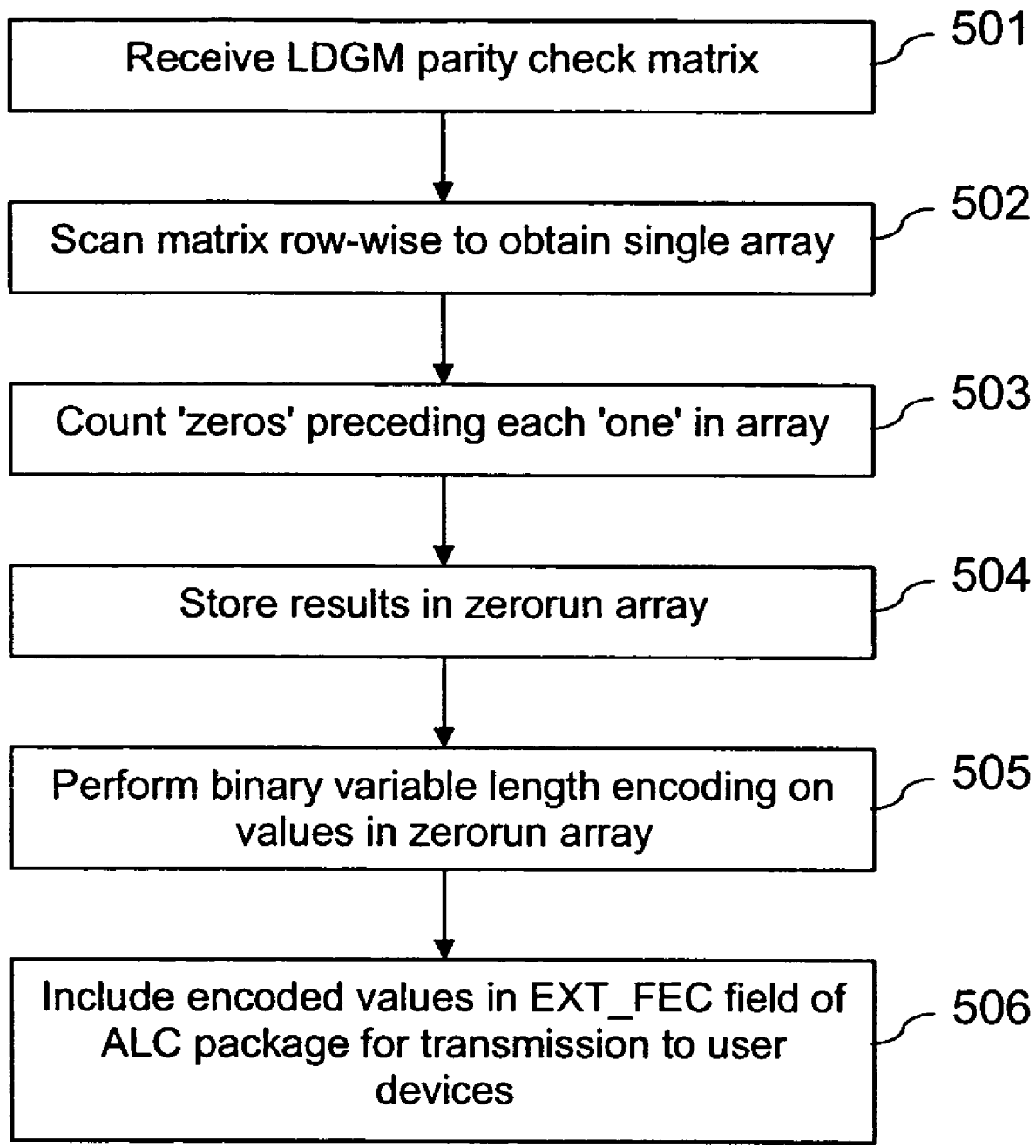
FIG. 5 is a flow chart illustrating a first exemplary matrix compression scheme and a first exemplary signaling scheme which may be implemented in the system of FIG. 4.

FIG. 5 is a flow chart illustrating a first example of a parity check matrix compression at the matrix compression portion 13 and a first example of an insertion of the resulting bitstream into an ALC packet by the encoding and packetizing portion 12.

It is assumed that an LDGM code provided by the code generator 11 is to be used for FEC encoding a media file having a size of 2 MB. The symbol size of the file data is assumed to be 512 Bytes, and a FEC overhead of 33% is to be used. More specifically, K=4096 data symbols are to result in N=6144 FEC encoded symbols, and consequently, there are to be N−K=2048 parity symbols. Thus, the LDPC parity check matrix associated to the employed LDGM code has N−K=2048 rows and N=6144 columns. The LDPC parity check matrix is very sparse and has a left degree of three. This means that each column has three 'ones' at random locations and all other elements are 'zeros'.

The matrix compression portion 13 receives the parity check matrix from the code generator 11 (step 501).

The matrix compression portion 13 scans the received matrix row-wise to build a single array of 'ones' and 'zeros' (step 502).

For each 'one' in this array, the number of preceding 'zeros' is counted (step 503) and stored in a separate array called "zerorun array" (step 504).

The elements of the zerorun array are binary coded. In case all elements of a zerorun array are to be encoded with the same number of bits, the number of bits needed to encode a respective zerorun element is determined by the maximum value of the elements in the zerorun array. In the above example, there are 16343 'ones' in the entire LDPC parity check matrix. The maximum value in the zerorun array 'max_zerorun' is 4505. Hence, ceil (log2 (max_zerorun)=13 bits are needed to represent each possible element in the zerorun array. Thus the total size of the run-length encoded LDPC matrix would be 16343*13=212459 bits=26.5 Kbytes. This corresponds to 52 packets having a size 512 Bytes each, or less than 1% of the total number of 6144 packets which have to be transmitted.

In the present example, however, the elements of the zerorun array are variable length encoded (step 505). That is, the number of bits used for a binary encoding of a respective element of the zerorun array is not always the same but depends on the value of the element. A variable length encoding allows a further reduction of the total number of bits which are to be transmitted.

The resulting bitstream is provided by the matrix compression portion 13 to the encoding and packetizing portion 12. The encoding and packetizing portion 12 inserts the bitstream as FEC OTI into an extension header field EXT_FTI of one or more of the ALC packets which are assembled for transmission to multiple user devices 20 (step 506). The HDR_LEN field of the LCT header of the ALC packets in which an header field EXT_FTI is included is adapted accordingly.

Figure 6:
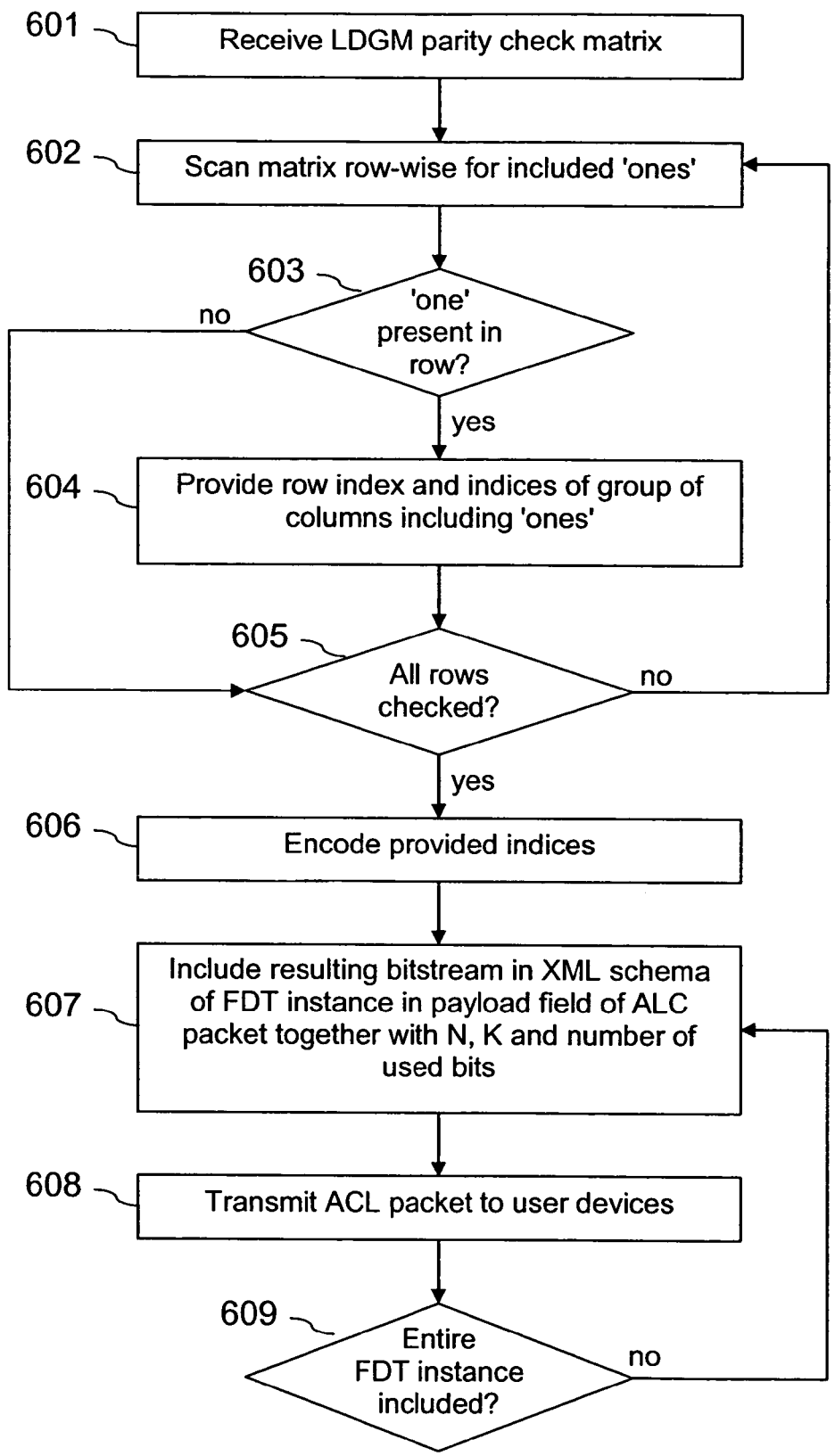
FIG. 6 is a flow chart illustrating a second exemplary matrix compression scheme and a second exemplary signaling scheme which may be implemented in the system of FIG. 4.

FIG. 6 is a flow chart illustrating a second example of a parity check matrix compression at the matrix compression portion 13 and a second example of an insertion of the resulting bitstream into an ALC packet at the encoding and packetizing portion 12.

The media file size, the symbol size, the FEC overhead and the values K and N are assumed to be the same as in the example described with reference to FIG. 5.

Since the LDPC parity check matrix matrix is very sparse, the row index and the column index of each 'one' in the matrix are transmitted in this case as compressed parity check matrix.

The matrix compression portion 13 receives the parity check matrix from the code generator 11 (step 601).

The matrix compression portion 13 scans the received matrix row-wise for detecting included 'ones' (step 602).

In case a 'one' is present in a scanned row (step 603), a row index and the indices of the columns including the 'ones' in the scanned row are provided (step 604).

Then, the respective next row is scanned (step 602), until all rows of the parity check matrix have been scanned (step 605).

The provided row and column indices are then encoded to form a bitstream (step 606).

A respective pair of a row index and a column index of each array element having a value of 'one' could be encoded for transmission. In this case, ceil (log2(N−K)) bits are needed to represent the row index and ceil (log2 (N)) bits are needed to represent each column index. For the example mentioned with reference to FIG. 5, there are 16343 'ones' in the parity check matrix. Therefore, 16343*(11+13)=392232 bits=49 Kbytes would be needed for encoding all pairs. This corresponds to 96 packets, each having a size of 512 Bytes, or 1.6% of the total number of packets that have to be transmitted.

In the present example, this number of packets is further reduced slightly by sending a respective row index and a group of column indices belonging to this row together. This way, each row index has to be transmitted only once at the most.

The resulting bitstream is provided by the matrix compression portion 13 to the encoding and packetizing portion 12. The encoding and packetizing portion 12 inserts the bitstream as FEC OTI into an XML schema of an FDT instance in the encoding symbols field of an ALC packet. The binary data can be embedded directly in the XML object using the CDATA tag. Alternatively, the binary data can be encoded into a text-based format that can be set as the contents of an XML element.

Other parameters which are needed to decode the compressed bitstream, like the values N and K, the number of bits used to encode the row and column indices etc., are also be included in the XML schema defined in the FLUTE FDT specification.

The assembled ALC packet is then transmitted to multiple user devices 20 (step 608).

If the bitstream is included in an FDT Instance, the total size of the FDT Instance could become rather large. The size of the compressed LDPC matrix could be for example 49 Kbytes. If the FDT Instance is longer than the payload size of the FLUTE packet (step 609), the FDT Instance is distributed to several ALC packets (steps 607, 608).

Thus, some of the ALC packets in the file delivery session are employed exclusively for transmitting the bitstream.

Figure 1:
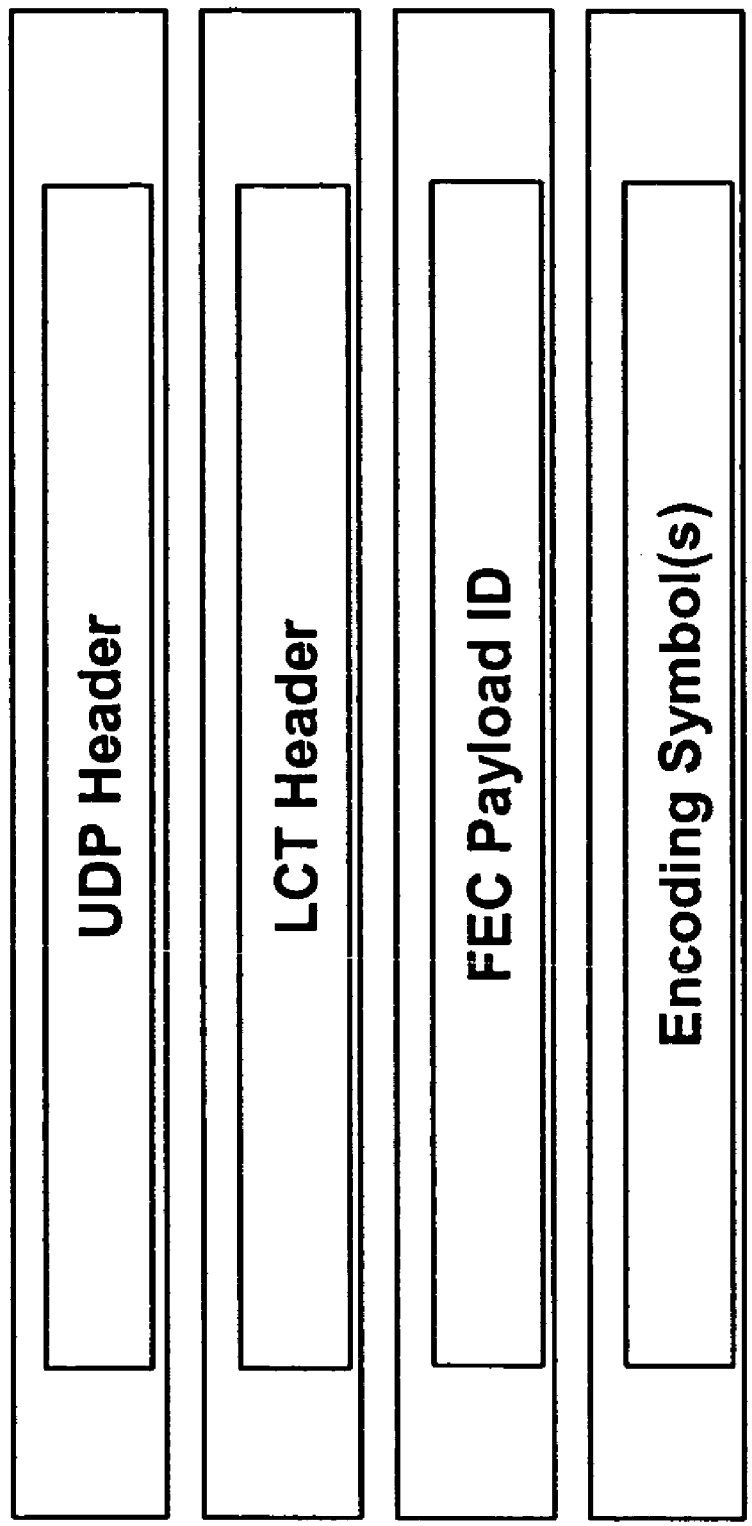
FIG. 1 is a diagram illustrating the overall ALC packet format.
Figure 2:
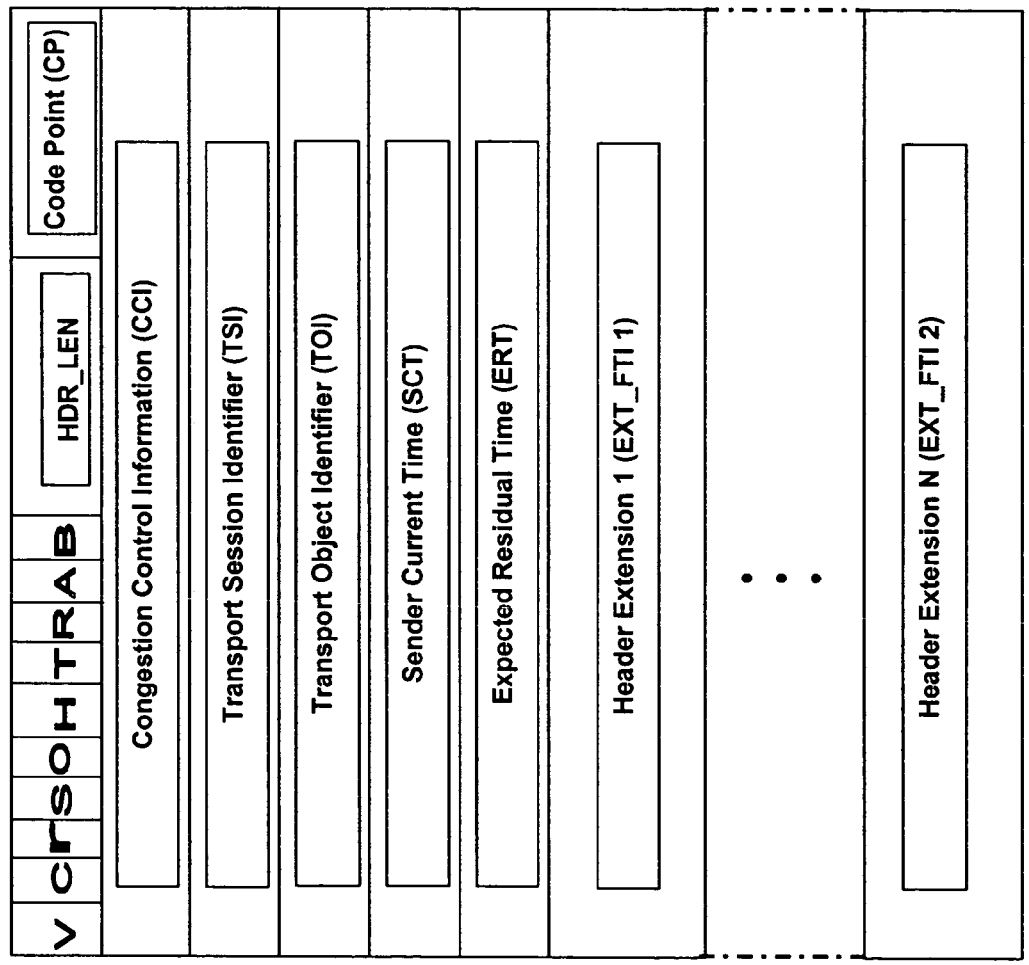
FIG. 2 is a diagram illustrating the LCT header format.
Figure 3:
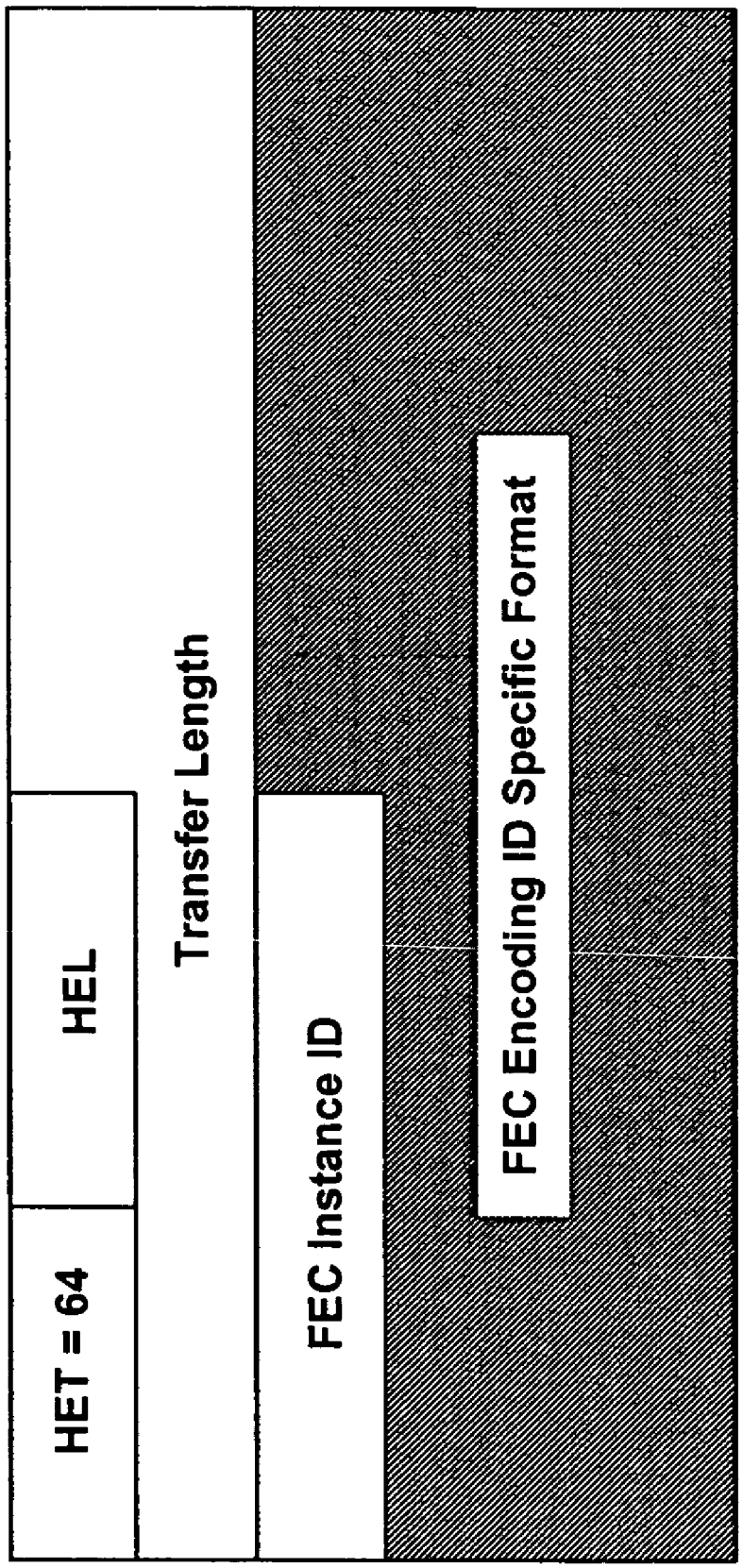
FIG. 3 is a diagram illustrating the EXT_FTI format for including the FEC OTI.

The FDT Instance may also be FEC encoded by the encoding and packetizing portion 12 using an LDPC code provided by the code generator 11. If this is the case, the parameters of the FEC scheme used for the FDT Instance, including the associated parity check matrix, must be signaled in advance to the user devices 20, either by using yet another FDT Instance or any other reliable mechanism. Such another reliable mechanism is indicated in FIG. 2 by an arrow with a dashed line.

The FEC Payload ID of the FDT Instance is used by the receiver to keep track which parts of an FDT Instance are received. Therefore, an FEC Payload ID is included in any FDT Instance packet, regardless of whether an FEC is used to protect them or not.

It is to be understood that the location in the ALC packet in which a compressed parity check matrix bitstream is included can be exchanged in the examples of FIGS. 5 and 6. In case the values of the zerorun array of FIG. 5 are to be included in an FDT instance, the parameters should include instead of the number of bits used to encode the row and column indices the number of bits used to code the zerorun array.

Figure 7:
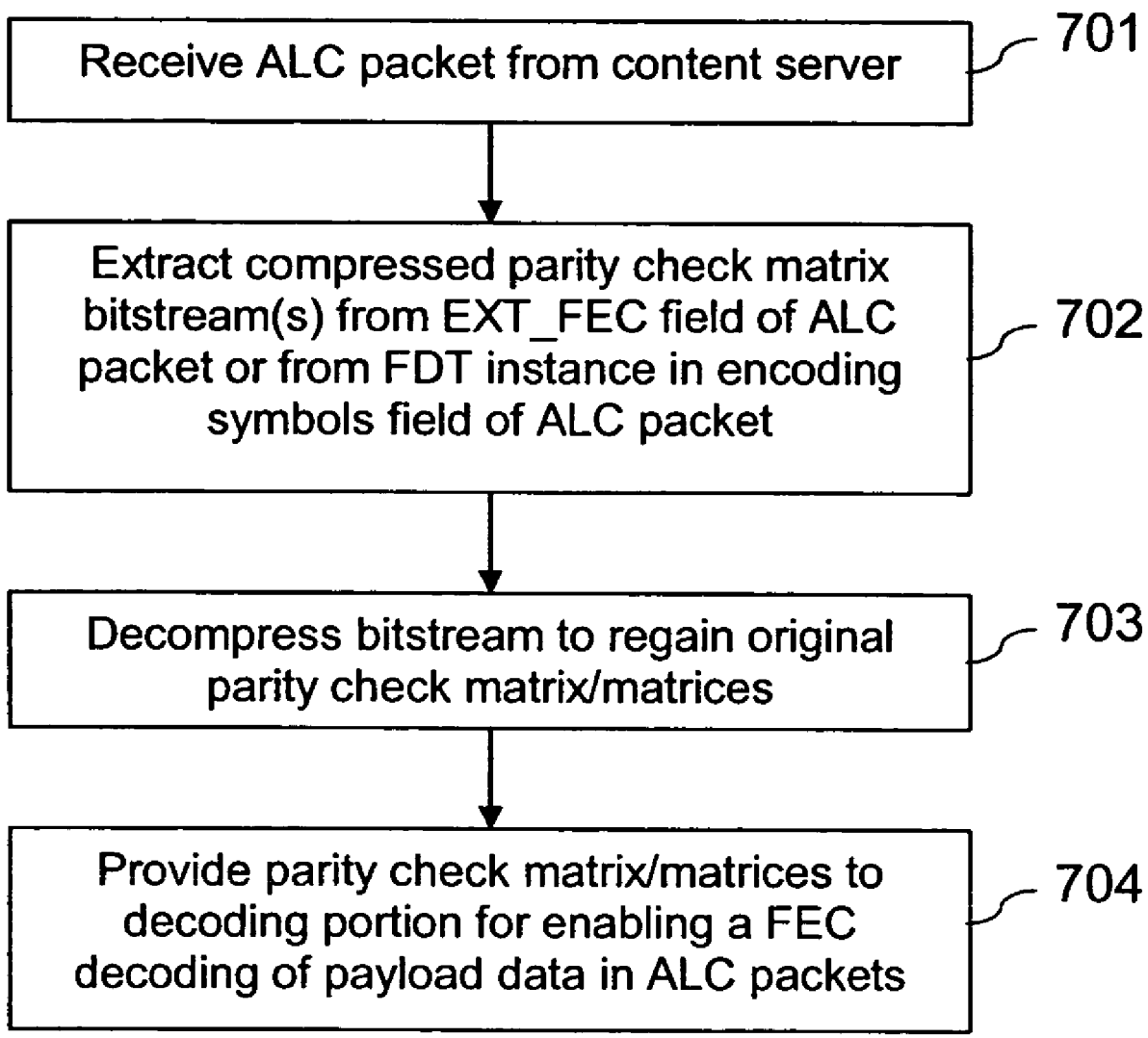
FIG. 7 is a flow chart illustrating an exemplary matrix decompression scheme which may be implemented in the system of FIG. 4.

FIG. 7 is a flow chart which illustrates the reconstruction of a compressed parity check matrix at a user device 20.

A depacketizing and decoding portion 22 of a user device 20 receives ALC packets from a content server 10 as a part of a multicast data file delivery (step 701).

The depacketizing and decoding portion 22 extracts a compressed parity check matrix bitstream and associated parameters from one or more ALC packet, for example from an EXT_FTI field or from an FDT Instance included in the encoding symbols field (step 702).

The compressed parity check matrix bitstream and the associated parameters are then provided to the matrix decompression portion 23.

The matrix decompression portion 23 decompresses the received compressed parity check matrix bitstream to reconstruct the original parity check matrix (step 703). This is achieved by reversing the compression operation applied to the respective original parity check matrix, for example the compression operation described with reference to FIG. 5 or the compression operation described with reference to FIG. 6.

The resulting parity check matrix is provided again to the depacketizing and decoding portion 22. The depacketizing and decoding portion 22 may now use the parity check matrix for an FEC based on the encoding symbols in received ALC packets (step 704) in order to reconstruct encoding symbols of corrupted or lost ALC packets, if required.

Figure 8:
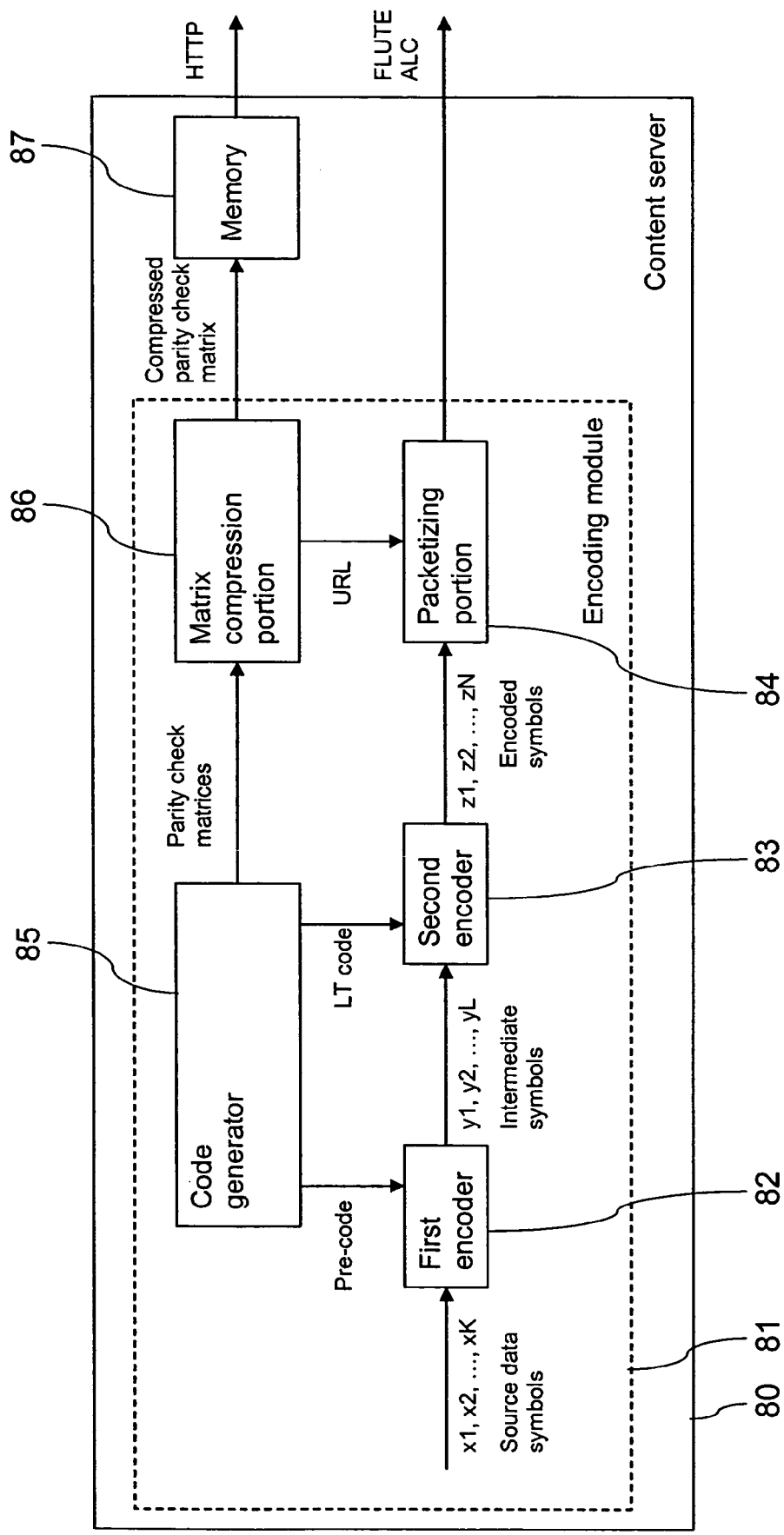
FIG. 8 is a schematic diagram illustrating a cascaded encoding portion which may be employed in the system of FIG. 4.

FIG. 8 is a schematic diagram of an alternative content server 80 including an encoding module 81 which applies two LDPC codes in a cascaded manner. The encoding module 81 comprises a first encoder 82, which is connected via a second encoder 83 to a packetizing portion 84. The encoding module 81 further comprises a code generator 85 and a matrix compression portion 86. The matrix compression portion 86 has access to a memory 87 of the content server 80. The code generator 85 provides a first LDPC code to the first encoder 82 and a second LDPC code to the second encoder 83. For both codes, the code generator 85 provides moreover an associated parity check matrix to the matrix compression portion 86.

The first code is called pre-code. The pre-code is essentially a static systematic irregular LDPC code. An LDPC code is called static, if its parity check matrix is pre-determined. The second code is called LT code. The LT code is essentially a dynamic LDPC code. An LDPC code is called dynamic, if the parity check matrix associated to a code changes on the fly as new output symbols are generated.

The first encoder 82 takes K data symbols x1, x2, x3 ... xK as input and outputs L intermediate symbols y1, y2, y3, ..., yL. The second encoder 83 takes L intermediate symbols as input and outputs N encoding symbols z1, z2, z3, ..., zN. Here L>K and N>L, that is, each constituent encoder 82, 83 adds redundancy to the input data symbols. The N encoding symbols are then assembled in the packetizing portion 84 into ALC packets for transmission.

Figure 9:
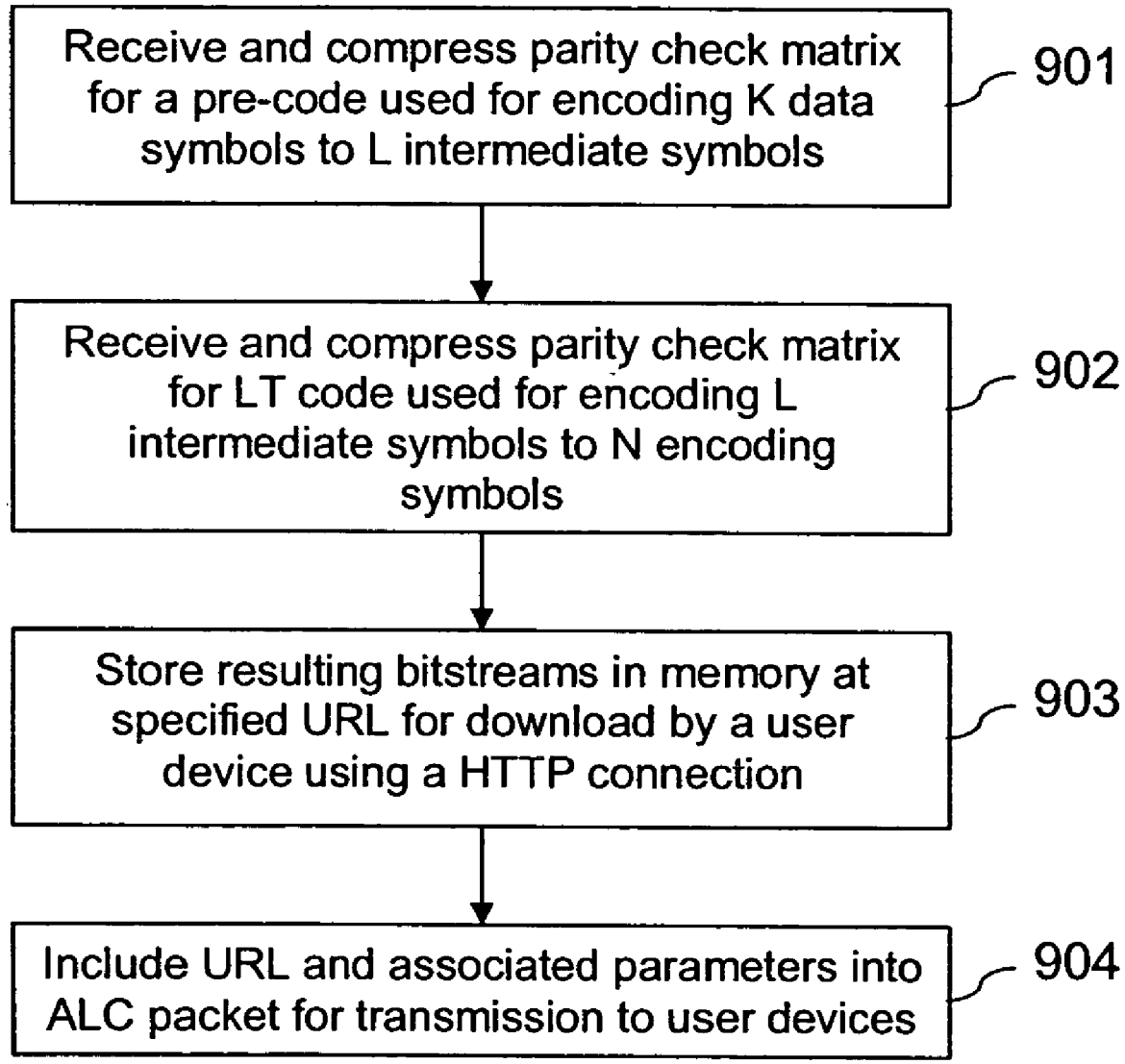
FIG. 9 is a flow chart illustrating a third exemplary matrix compression scheme which may be used for the cascaded encoding portion of FIG. 8.

An exemplary treatment of the parity check matrices associated to the codes which are used by such cascaded encoders 82, 83 will now be described with reference to FIG. 9.

First, the matrix compression portion 86 receives and compresses the LDPC parity check matrix associated to the pre-code (step 901). For the compression, the matrix compression portion 86 may use any suitable compression scheme, for example the run-length based compression described with reference to FIG. 5 or the row and column indices based compression described with reference to FIG. 6.

Next, the matrix compression portion 86 receives and compresses the LDPC parity check matrix associated to the LT code (step 902). For the compression, the matrix compression portion 86 may use again any suitable compression scheme, for example the run-length based compression described with reference to FIG. 5 or the row and column indices based compression described with reference to FIG. 6.

The bitstreams corresponding to each constituent code are provided by the matrix compression portion 86 to the memory 87 at specified URLs, from which the bitstreams can be downloaded by user devices 20 using a HTTP connection (step 903).

The matrix compression portion 86 moreover indicates the URLs from which the bitstreams can be downloaded and parameters associated to the bitstreams to the packetizing portion 84.

The packetizing portion 84 includes the URLs and the parameters into one or more ALC packets, as described for a bitstream with reference to FIG. 5 or as described for a bitstream with reference to FIG. 6 for transmission to the user devices (step 904).

The user devices can be similar to the user device 20 of FIG. 4. The matrix decompression portion 23 does not receive the bitstreams from the depacketizing and decoding portion 22, though, but only the URLs and parameters included in one or more ALC packets. The bitstreams are then downloaded from the content server 80 from these URLs using a HTTP connection. The matrix decompression portion 23 decompresses the downloaded bitstreams to recover the original parity check matrices and provides these matrices to the depacketizing and decoding portion 22. The depacketizing and decoding portion 22 may then use the parity check matrices for a conventional cascaded FEC, if an FEC is required for recovering lost or corrupted ALC packets.

It is to be understood that also with cascaded encoders, the compressed parity check matrix bitstream itself could be transmitted to user devices in ALC packets, as described with reference to FIGS. 5 and 6, respectively. Further, it is to be understood that also with a single encoder, only an URL from which the bitstream can be downloaded could be provided to the user devices.

While there have been shown and described and pointed out fundamental novel features of the invention as applied to a preferred embodiment thereof, it will be understood that various omissions and substitutions and changes in the form and details of the devices and methods described may be made by those skilled in the art without departing from the spirit of the invention. For example, it is expressly intended that all combinations of those elements and/or method steps, which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A method for supporting a forward error correction scheme, wherein at least one code of said forward error correction scheme is employed at a transmitting end for encoding data for transmission to a receiving end, said method at said transmitting end comprising:
receiving at least one binary parity check matrix associated with said at least one code of said forward error correction scheme, wherein said at least one binary parity check matrix comprises entries having a first value and entries having a second value;
selecting a row index and a column index for each of said entries having said first value; and
providing said selected row and column indices for transmission to said receiving end.

2. The method according to claim 1, wherein for each row of said at least one binary parity check matrix comprising at least one entry having said first value, a single row index and all column indices for each of said entries having said first value are provided for transmission to receiving end, or wherein for each column of said at least one binary parity check matrix comprising at least one entry having said first value, a single column index and all row indices for each of said entries having said first value are provided for transmission to said receiving end.

3. The method according to claim 1, wherein at least two cascaded codes of said forward error correction scheme are employed at said transmitting end for encoding data for transmission to said receiving end, wherein a distinct binary parity check matrix is associated with each of said at least two cascaded codes, and wherein each of said binary parity check matrices is separately provided for transmission to said receiving end.

4. The method according to claim 1, wherein said at least one binary parity check matrix comprises at least one linear density parity code matrix.

5. The method according to claim 1, wherein said encoded data is to be transmitted to said receiving end in Asynchronous Layer Coding (ALC) packets and wherein said at least one binary parity check matrix is included in Forward Error Correction Object Transmission Information (FEC OTI) in at least one ALC packet for transmission to said receiving end.

6. The method according to claim 5, wherein said FEC OTI is included in a FEC OTI header extension ($EXT_{13}FTI$) of at least one ALC packet.

7. The method according to claim 5, wherein said FEC OTI is included in an eXtensible Markup Language (XML) schema of a File Description Table (FDT) Instance included in an encoding symbols portion of at least one ALC packet.

8. The method according to claim 1, wherein said selected row and column indices are provided by storing the indices at a download address for a download by said receiving end, and wherein the download address is transmitted to said receiving end.

9. An electronic device comprising:
   an encoding portion configured to encode data for transmission to a receiving end using at least one code of a forward error correction scheme; and
   a matrix compression portion configured to compress at least one binary parity check matrix associated to said at least one code of said forward error correction scheme, and configured to provide said at least one compressed binary parity check matrix for transmission to said receiving end, wherein said at least one binary parity check matrix comprises entries having a first value and entries having a second value, and wherein compression of said at least one binary parity check matrix comprises selecting a row index and a column index for each of said entries having said first value and providing said selected row and column indices for transmission to said receiving end.

10. The electronic device according to claim 9, wherein for each row of said at least one binary parity check matrix comprising at least one entry having said first value, a single row index and all column indices for each of said entries having said first value are provided for transmission to receiving end, or wherein for each column of said at least one binary parity check matrix comprising at least one entry having said first value, a single column index and all row indices for each of said entries having said first value are provided for transmission to said receiving end.

11. The electronic device according to claim 9, wherein at least two cascaded codes of said forward error correction scheme are employed at said transmitting end for encoding data for transmission to said receiving end, wherein a distinct binary parity check matrix is associated with each of said at least two cascaded codes, and wherein each of said binary parity check matrices is separately provided for transmission to said receiving end.

12. The electronic device according to claim 9, wherein said encoded data is to be transmitted to said receiving end in Asynchronous Layer Coding (ALC) packets and wherein said at least one binary parity check matrix is included in Forward Error Correction Object Transmission Information (FEC OTI) in at least one ALC packet for transmission to said receiving end.

13. The electronic device according to claim 12, wherein said FEC OTI is included in a FEC OTI header extension (EXT_FTI) of at least one ALC packet.

14. The electronic device according to claim 12, wherein said FEC OTI is included in an eXtensible Markup Language (XML) schema of a File Description Table (FDT) Instance included in an encoding symbols portion of at least one ALC packet.

15. The electronic device according to claim 9, wherein said selected row and column indices are provided by storing the indices at a download address for a download by said receiving end, and wherein the download address is transmitted to said receiving end.

16. A system in which a software code for supporting a forward error correction scheme is stored, wherein at least one code of said forward error correction scheme is employed at a transmitting end for encoding data for transmission to a receiving end, the system comprising:
   a processor;
   a communications interface coupled to the processor; and
   a computer-readable medium coupled to the processor and having computer-readable instructions stored therein that, upon execution by the processor, perform operations comprising:
   receiving at least one binary parity check matrix associated with said at least one code of said forward correction scheme, wherein said at least one binary parity check matrix comprises entries having a first value and entries having a second value;
   selecting a row index and a column index for each of said entries having said first value; and
   providing said selected row and column indices for transmission to said receiving end.

17. The system according to claim 16, wherein for each row of said at least one binary parity check matrix comprising at least one entry having said first value, a single row index and all column indices for each of said entries having said first value are provided for transmission to receiving end, or wherein for each column of said at least one binary parity check matrix comprising at least one entry having said first value, a single column index and all row indices for each of said entries having said first value are provided for transmission to said receiving end.

18. The system according to claim 16, wherein at least two cascaded codes of said forward error correction scheme are employed at said transmitting end for encoding data for transmission to said receiving end, wherein a distinct binary parity check matrix is associated with each of said at least two cascaded codes, and wherein each of said binary parity check matrices is separately provided for transmission to said receiving end.

19. The system according to claim 16, wherein said encoded data is to be transmitted to said receiving end in Asynchronous Layer Coding (ALC) packets and wherein said at least one binary parity check matrix is included in Forward Error Correction Object Transmission Information (FEC OTI) in at least one ALC packet for transmission to said receiving end.

20. The system according to claim 19, wherein said FEC OTI is included in a FEC OTI header extension (EXT_FTI) of at least one ALC packet.

21. The system according to claim 19, wherein said FEC OTI is included in an eXtensible Markup Language (XML) schema of a File Description Table (FDT) Instance included in an encoding symbols portion of at least one ALC packet.

22. The system according to claim 16, wherein said selected row and column indices are provided by storing the indices at a download address tor a download by said receiving end, and wherein the download address is transmitted to said receiving end.

23. A method for supporting a forward error correction scheme, said method comprising at a receiving end:
receiving at a machine at a receiving end of a communication system at least one compressed binary parity check matrix, wherein the received compressed binary parity check matrix includes row and column indices; and
generating a binary check matrix including entries having a first value and entries having a second value, wherein the first value is included in the positions indicated by row the and column indices and the second value is included in the remaining positions.

24. The method according to claim 23, wherein the row and column indices include a single row index and all column indices for each of said entries having said first value, or wherein the row and column indices include a single column index and all row indices for each of said entries having said first value.

25. The method according to claim 23, wherein a distinct binary parity check matrix is associated with each of at least two cascaded codes, and wherein each of said binary parity check matrices is separately received.

26. The method according to claim 23, wherein encoded data is received in Asynchronous Layer Coding (ALC) packets and wherein said at least one compressed binary parity check matrix is received in Forward Error Correction Object Transmission Information (FEC OTI) in at least one ALC packet.

27. The method according to claim 26, wherein said FEC OTI is included in a FEC OTI header extension of at least one ALC packet.

28. The method according to claim 26, wherein said FEC OTI is included in an eXtensible Markup Language schema of a File Description Table Instance included in an encoding symbols portion of at least one ALC packet.

29. The method according to claim 23, wherein the received compressed binary parity check matrix is received from a download address received from said transmitting end.

30. An electronic device comprising:
a matrix decompression portion configured to decompress at least one compressed binary parity check matrix received from a transmitting end; and
a decoding portion configured to use said at least one decompressed binary parity check matrix in a forward error correction based on encoded data received from said transmitting end, wherein said at least one binary parity check matrix comprises entries having a first value and entries having a second value, and wherein the decoding portion generates a matrix having the second value in all entries and substituting the first value at the positions indicated by row and column indices.

31. The electronic device according to claim 30, wherein the row and column indices include a single row index and all column indices for each of said entries having said first value, or wherein the row and column indices include a single column index and all row indices for each of said entries having said first value.

32. The electronic device according to claim 30, wherein a distinct binary parity check matrix is associated with each of at least two cascaded codes, and wherein each of said binary parity check matrices is separately received.

33. The electronic device according to claim 30, wherein said encoded data is received in Asynchronous Layer Coding (ALC) packets and wherein said at least one compressed binary parity check matrix is received in Forward Error Correction Object Transmission Information (FEC OTI) in at least one ALC packet.

34. The electronic device according to claim 33, wherein said FEC OTI is included in a FEC OTI header extension of at least one ALC packet.

35. The electronic device according to claim 33, wherein said FEC OTI is included in an eXtensible Markup Language schema of a File Description Table Instance included in an encoding symbols portion of at least one ALC packet.

36. The electronic device according to claim 30, the received compressed binary parity check matrix is received from a download address received from said transmitting end.

37. A system in which a software code for supporting a forward error correction scheme is stored, the system comprising:
a processor;
a communications interface coupled to the processor; and
a computer-readable medium coupled to the processor and having computer-readable instructions stored therein that, upon execution by the processor, perform operations comprising:
receiving at least one compressed binary parity check matrix from a transmitting end, wherein the received compressed binary parity check matrix includes row and column indices; and
generating a binary parity check matrix including entries having a first value and entries having a second value, wherein the first value is included in the positions indicated by the row and column indices and the second value is included in the remaining positions.

38. The system according to claim 37, wherein the row and column indices include a single row index and all column indices for each of said entries having said first value, or wherein the row and column indices include a single column index and all row indices for each of said entries having said first value.

39. The system according to claim 37, wherein a distinct binary parity check matrix is associated with each of at least two cascaded codes, and wherein each of said binary parity check matrices is separately received.

40. The system according to claim 37, wherein said encoded data is received in Asynchronous Layer Coding (ALC) packets and wherein said at least one compressed binary parity check matrix is received in Forward Error Correction Object Transmission Information (FEC OTI) in at least one ALC packet.

41. The system according to claim 40, wherein said FEC OTI is included in a FEC OTI header extension of at least one ALC packet.

42. The system according to claim 40, wherein said FEC OTI is included in an eXtensible Markup Language schema of a File Description Table Instance included in an encoding symbols portion of at least one ALC packet.

43. The system according to claim 37, wherein the received compressed binary parity check matrix is received from a download address received from said transmitting end.

* * * * *

UNITED STATES PATENT AND TRADEMARK OFFICE
CERTIFICATE OF CORRECTION

PATENT NO. : 7,594,154 B2  Page 1 of 1
APPLICATION NO. : 10/991968
DATED : September 22, 2009
INVENTOR(S) : Ramakrishna Vedantham et al.

It is certified that error appears in the above-identified patent and that said Letters Patent is hereby corrected as shown below:

Title Page, (*) Notice: Subject to any disclaimer, the term of this patent is extended or adjusted under 35 U.S.C. 154(b) by 505 days.

should read (*) Notice: Subject to any disclaimer, the term of this patent is extended or adjusted under 35 U.S.C. 154(b) by 579 days.

Signed and Sealed this

Fourth Day of May, 2010

David J. Kappos
*Director of the United States Patent and Trademark Office*